United States Patent
Li

(10) Patent No.: US 9,831,354 B2
(45) Date of Patent: Nov. 28, 2017

(54) SPLIT-GATE FLASH MEMORY HAVING MIRROR STRUCTURE AND METHOD FOR FORMING THE SAME

(71) Applicant: Shanghai Huahong Grace Semiconductor Manufacturing Corporation, Shanghai (CN)

(72) Inventor: Binghan Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/968,108

(22) Filed: Dec. 14, 2015

(65) Prior Publication Data

US 2016/0190335 A1 Jun. 30, 2016

(30) Foreign Application Priority Data

Dec. 30, 2014 (CN) .......................... 2014 1 0855027

(51) Int. Cl.
*H01L 21/336* (2006.01)
*H01L 29/788* (2006.01)
(Continued)

(52) U.S. Cl.
CPC .... *H01L 29/7885* (2013.01); *H01L 21/28273* (2013.01); *H01L 29/42328* (2013.01); *H01L 29/66545* (2013.01); *H01L 29/7881* (2013.01)

(58) Field of Classification Search
None
See application file for complete search history.

(56) References Cited

U.S. PATENT DOCUMENTS 6,376,876 B1 * 4/2002 Shin .................. H01L 27/115
257/315
6,720,579 B2 * 4/2004 Shin .................. H01L 27/11521
257/315
(Continued)

FOREIGN PATENT DOCUMENTS

CN 1794458 A 6/2006
CN 101777521 A 7/2010
(Continued)

OTHER PUBLICATIONS

English translation of CN101777521, 10 pgs, dated Dec. 28, 2016 from Google Patents: https://patents.google.com/patent/CN101777521A/en.*
(Continued)

*Primary Examiner* — David E Graybill
(74) *Attorney, Agent, or Firm* — Harness, Dickey & Pierce, P.L.C.

(57) ABSTRACT

Split-gate flash memory and forming method thereof are provided. The method includes: forming a first dielectric layer on a semiconductor substrate; forming a floating gate layer on the first dielectric layer; forming a mask layer on the floating gate layer; etching the mask layer until first groove exposing the floating gate layer is formed; forming a protective sidewall on sidewall of the first groove; forming a gate dielectric layer on bottom and the sidewall of the first groove; forming two control gates on the gate dielectric layer, the remained first groove serving as second groove; etching the gate dielectric layer and the floating gate layer at bottom of the second groove until third groove exposing the first dielectric layer is formed; forming a source in the semiconductor substrate under the third groove; and forming a second dielectric layer in the third groove. Reliability and durability of the memory are improved.

6 Claims, 11 Drawing Sheets

(51) Int. Cl.
  *H01L 29/66* (2006.01)
  *H01L 21/28* (2006.01)
  *H01L 29/423* (2006.01)

(56) References Cited

U.S. PATENT DOCUMENTS

| | | | |
|---|---|---|---|
| 6,797,570 B2* | 9/2004 | Shin | H01L 27/11521 257/E21.682 |
| 6,936,885 B2* | 8/2005 | Shin | H01L 27/11524 257/315 |
| 7,271,061 B2 | 9/2007 | Jeon et al. | |
| 7,339,242 B2* | 3/2008 | Cho | H01L 27/105 257/197 |
| 7,586,146 B2 | 9/2009 | Jeon et al. | |
| 8,247,291 B2* | 8/2012 | Min | H01L 21/0337 257/E21.538 |
| 8,891,316 B2* | 11/2014 | Seo | G11C 16/0425 365/185.08 |
| 2002/0081806 A1* | 6/2002 | Shin | H01L 27/115 438/257 |
| 2002/0145915 A1 | 10/2002 | Ogura et al. | |
| 2004/0056316 A1* | 3/2004 | Prall | H01L 21/76895 257/390 |
| 2005/0023600 A1* | 2/2005 | Shin | H01L 27/11524 257/315 |
| 2006/0062069 A1 | 3/2006 | Jeon et al. | |
| 2008/0029808 A1 | 2/2008 | Jeon et al. | |
| 2010/0110753 A1* | 5/2010 | Slesazeck | G11C 5/063 365/145 |
| 2011/0248317 A1* | 10/2011 | Kim | H01L 27/11548 257/208 |
| 2012/0243339 A1* | 9/2012 | Seo | G11C 16/0425 365/185.29 |
| 2016/0027792 A1 | 1/2016 | Zhang | |

FOREIGN PATENT DOCUMENTS

| CN | 103050446 A | 4/2013 |
|---|---|---|
| CN | 103346157 A | 10/2013 |
| CN | 104091803 A | 10/2014 |

OTHER PUBLICATIONS

First Chinese Office Action regarding Application No. 201410855027.9 dated Nov. 16, 2016. English translation provided by Unitalen Attorneys at Law.

* cited by examiner

SPLIT-GATE FLASH MEMORY HAVING MIRROR STRUCTURE AND METHOD FOR FORMING THE SAME

CROSS-REFERENCE TO RELATED APPLICATIONS

The present application claims priority to Chinese patent application No. 201410855027.9, filed on Dec. 30, 2014, and entitled "SPLIT-GATE FLASH MEMORY HAVING MIRROR STRUCTURE AND METHOD FOR FORMING THE SAME", and the entire disclosures of which is incorporated herein by reference.

TECHNICAL FIELD

The present disclosure generally relates to semiconductor manufacturing field, and more particularly, to a split-gate flash memory having a mirror structure and a method for forming the same.

BACKGROUND

In current semiconductor industry, integrated circuits can be classified into three types including logic circuits, memories and analog circuits. Memory devices, such as Random-Access Memory (RAM), Dynamic Random Access Memory (DRAM), Read-Only Memory (ROM), Erasable Programmable Read-Only Memory (EPROM), Flash Memory or Ferromagnetic Random Access Memory (FRAM), occupy a relatively large portion of integrated circuit products. Particularly, flash memories have been developed rapidly and have multiple advantages. For example, flash memories can store information permanently without being provided with power, have a high integration level and high access speed, and is easily erased. Therefore, flash memories are widely used in multiple fields, such as microcomputer or automation control.

Flash memories can be classified into two types, including stacked-gate devices and split-gate devices, where a stacked-gate device further includes a floating gate and a control gate on the floating gate. It is easier to manufacture a stacked-gate device than a split-gate device. However, stacked-gate devices generally have over-erase problem. To solve the problem, verification needs to be performed after erasure circulation to maintain a threshold voltage of a cell within a voltage range, which may increase the complexity of circuit design. To a split-gate device, a control gate thereof serves as a select transistor, which may effectively avoid over-erase effect and simplifies circuit design. Besides, in the split-gate device, programming is performed by hot electron injection at source, which may have higher programming efficiency. Therefore, split-gate devices are widely used in various electronic products, such as smart cards, Subscriber Identity Module (SIM) cards, microcontrollers or mobile phones.

More information about split-gate flash memories can be found in Chinese patent Publication No. CN103050446A (publication date: Dec. 20, 2012).

Due to poor erasure ability, split-gate flash memories formed by existing methods have poor reliability and durability.

SUMMARY

In embodiments of the present disclosure, a split-gate flash memory having a mirror structure and a method for forming the same are provided. The split-gate flash memory may have improved reliability and durability, and process procedures may be simplified.

In an embodiment, a method for forming a split-gate flash memory having a mirror structure is provided, including: providing a semiconductor substrate; forming a first dielectric layer on the semiconductor substrate; forming a floating gate layer on the first dielectric layer; forming a mask layer on the floating gate layer; etching the mask layer until a first groove which exposes the floating gate layer is formed; forming a protective sidewall on a sidewall of the first groove; forming a gate dielectric layer on the bottom and the sidewall of the first groove; forming two discrete control gates on the gate dielectric layer in the first groove, wherein remained portion of the first groove is taken as a second groove; etching the gate dielectric layer and the floating gate layer at the bottom of the second groove until a third groove which exposes the first dielectric layer is formed; forming a source in the semiconductor substrate under the third groove; and forming a second dielectric layer in the third groove.

Optionally, the method may further include: after the second dielectric layer is formed, removing the mask layer to form a fourth groove; removing the floating gate layer at bottom of the fourth groove; forming a tunnel dielectric layer on bottom and a sidewall of the fourth groove, on an upper surface of the control gate and on an upper surface of the second dielectric layer; forming a word line in the fourth groove; forming an interlayer dielectric layer to cover the word line and the tunnel dielectric layer; etching a portion of the second dielectric layer, a portion of the tunnel dielectric layer and a portion of the interlayer dielectric layer over the source to form a through hole that exposes the source; and forming a contact plug in the through hole.

Optionally, the protective sidewall may include silicon oxide.

Optionally, thickness of the protective sidewall when the protective sidewall is formed may be within a range from 200 Å to 250 Å; and when the fourth groove is formed, the protective sidewall is etched partially, and the thickness of the protective sidewall remained after etching may be within a range from 150 Å to 200 Å.

Optionally, before the gate dielectric layer is formed, the method may further include: etching a portion of the floating gate layer at the bottom of the first groove by taking the remained mask layer as a mask, so that the first groove has a cambered bottom.

Optionally, the second dielectric layer may include silicon oxide.

Optionally, the method further include: after the source is formed, cleaning the third groove to remove the first dielectric layer at the bottom of the third groove.

In an embodiment, a split-gate flash memory having a mirror structure is provided, including: a semiconductor substrate; a source in the semiconductor substrate; a second dielectric layer disposed over the source; a first dielectric layer disposed on the semiconductor substrate on two sides of the second dielectric layer; a floating gate disposed on the first dielectric layer; a gate dielectric layer disposed on the floating gate; a control gate disposed on the gate dielectric layer; a tunnel dielectric layer disposed on a sidewall of the floating gate, on a sidewall of the gate dielectric layer and on an upper surface of the control gate; and a word line disposed on a sidewall of the tunnel dielectric layer.

Optionally, the split-gate flash memory may further include a protective sidewall disposed between the sidewall of the tunnel dielectric layer and the sidewall of the gate dielectric layer; an interlayer dielectric layer covering the tunnel dielectric layer; and a contact plug which penetrates the interlayer dielectric layer, the tunnel dielectric layer and the second dielectric layer, where the contact plug is electrically connected with the source.

Optionally, the protective sidewall may include silicon oxide.

Optionally, thickness of the protective sidewall may be within a range from 150 Å to 200 Å.

Compared with the existing techniques, embodiments of the present disclosure may have following advantages. In embodiments of the present disclosure, the protective sidewall is formed between the word line and the control gate, which increases thickness of the dielectric layer between the word line and the control gate, and prevents the gate dielectric layer from being affected by related etching processes. Therefore, the dielectric layer can suffer a relatively high voltage between the word line and the control gate during an erase process, and this may further improve reliability and durability of the split-gate flash memory having the mirror structure.

Further, the thickness of the protective sidewall when it is formed may be within the range from 200 Å to 250 Å. As being affected by etching processes, the thickness of the protective sidewall may be decreased. Besides, when the floating gate layer under the mask layer is etched, the protective sidewall is further etched, which may further decrease the thickness of the protective sidewall. Therefore, the thickness of the protective sidewall when it is formed should be greater than 200 Å, to ensure the thickness of the protective sidewall remained can meet requirements. Meanwhile, if the thickness of the protective sidewall remained is too great, thickness of the gate dielectric layer to be formed subsequently may not meet requirements. Therefore, when forming the protective sidewall, it is also necessary to control the thickness of the protective sidewall less than 250 Å.

DETAILED DESCRIPTION

As described in background, split-gate flash memories formed by existing methods have poor erasure ability. In existing techniques, a relatively high voltage needs to be applied between a word line and a control gate during an erasure process. However, in the existing split-gate flash memories, a dielectric layer between the word line and the control gate may not suffer the relatively high voltage, thus reliability and durability of the split-gate flash memories may be relatively poor.

In embodiments of the present disclosure, a split-gate flash memory having a mirror structure and a method for forming the same are provided. In the split-gate flash memory, a protective sidewall is disposed between a word line and a control gate, which increases thickness of a dielectric layer between the word line and the control gate. As a result, the dielectric layer's ability of suffering a high voltage between the word line and the control gate during an erasure process may be enhanced, and further reliability and durability of the split-gate flash memory may be improved.

In order to clarify the objects, characteristics and advantages of the disclosure, embodiments of present disclosure will be described in detail in conjunction with accompanying drawings.

Referring to FIGS. 1 to 21, in an embodiment, a method for forming a split-gate flash memory having a mirror structure is provided.

Figure 1:
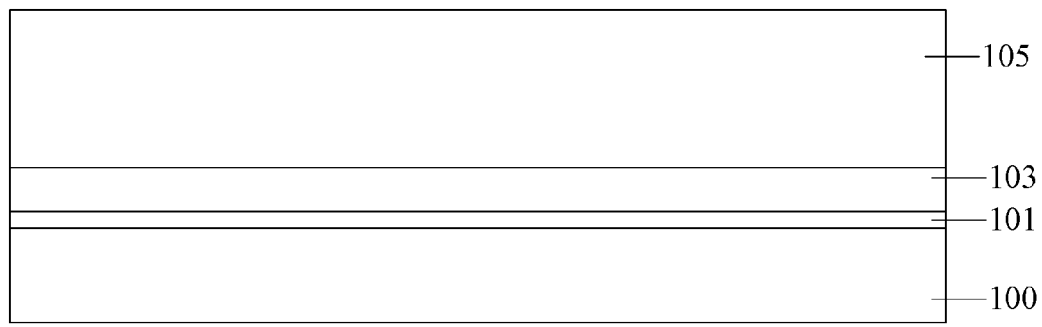
FIGS. 1 to 21 schematically illustrate sectional views of intermediate structures of a method for forming a split-gate flash memory having a mirror structure according to an embodiment of the present disclosure.

Referring to FIG. 1, a semiconductor substrate 100 is provided, a first dielectric layer 101 is formed on the semiconductor substrate 100, a floating gate layer 103 is formed on the first dielectric layer 101, and a mask layer 105 is formed on the floating gate layer 103.

In some embodiments, the semiconductor substrate 100 may be a silicon substrate. In some embodiments, the semiconductor substrate 100 may include germanium-silicon, compounds of III to IV group elements or silicon carbide. In some embodiments, the semiconductor substrate 100 may have a stacked structure, or may be a Silicon-on-Insulator (SOI) substrate. In some embodiments, the semiconductor substrate 100 may have other semiconductor materials. An isolation structure may be formed between different regions in the semiconductor substrate 100. In some embodiments, the isolation structure may be a shallow trench isolation (STI) region or a field oxide layer.

Figure 2:
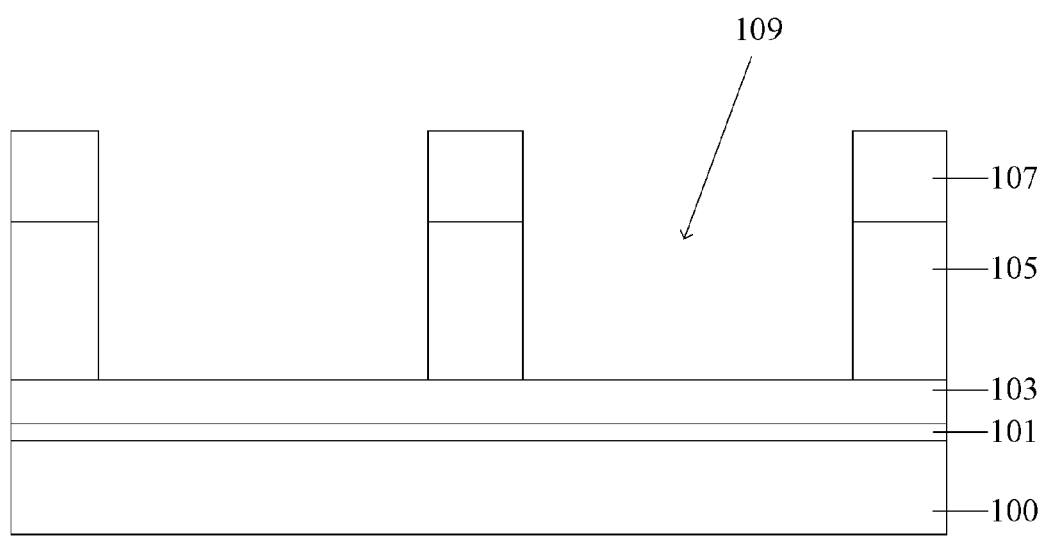

Referring to FIG. 2, a patterned photoresist layer 107 is formed on the mask layer 105, and the mask layer 105 is etched by taking the patterned photoresist layer 107 as a mask until a first groove 109 which exposes the floating gate layer 103 is formed.

In some embodiments, the first dielectric layer 101 may include silicon oxide. In some embodiments, the floating gate layer 103 may include polysilicon. In some embodiments, the mask layer 105 may include silicon nitride.

In above embodiments, the patterned photoresist layer 107 is used as the mask to etch the mask layer 105. In some embodiments, the mask layer 105 may be etched by other methods to form the first groove 109. That is to say, although the above embodiments provide a method for forming the first groove 109, the present disclosure is not limited thereto.

Figure 3:
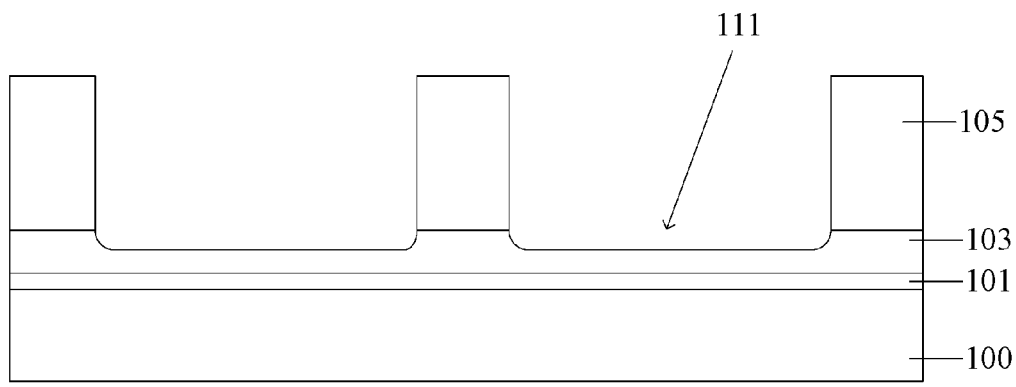

Referring to FIG. 3, a portion of the floating gate layer 103 at the bottom of the first groove 109 is etched by taking the remained mask layer 105 as a mask, so that the first groove 109 becomes a first groove 111 having a cambered bottom.

Figure 14:
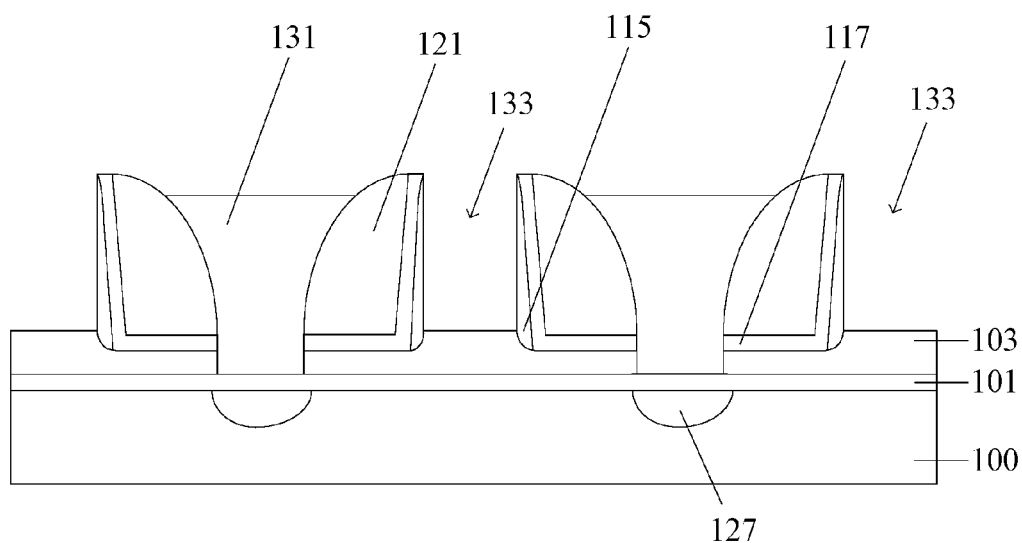

In some embodiments, the cambered bottom means the bottom of the first groove 111 exhibits a camber in a sectional view. Specifically, from a center of the bottom of the first groove 111 to edges of the bottom of the first groove 111, depth of the first groove 111 becomes smaller gradually, as shown in FIG. 3. The cambered bottom of the first groove 111 may enable a floating gate to be formed subsequently to have a small tip (as shown in FIG. 14). The floating gate having the small tip may improve erase ability of the flash memory.

In some embodiments, the portion of the floating gate layer 103 at the bottom of the first groove 109 may be etched using an isotropy etching process.

Figure 4:
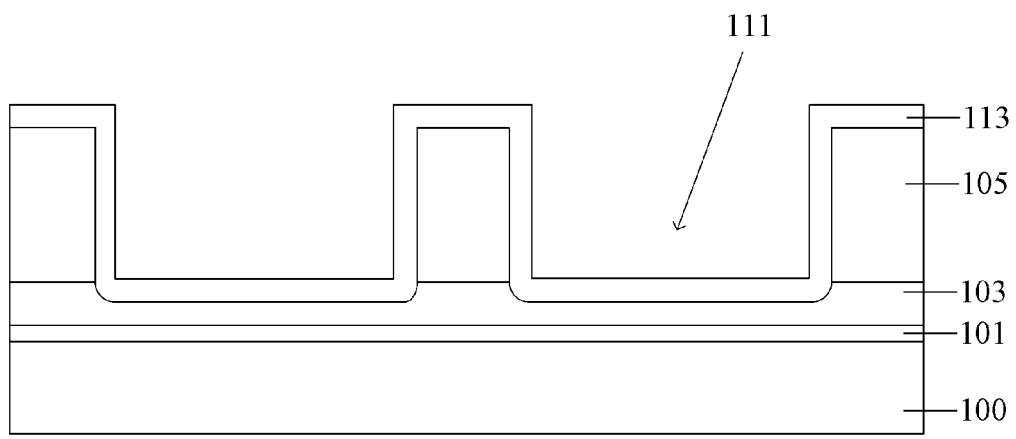
Figure 5:
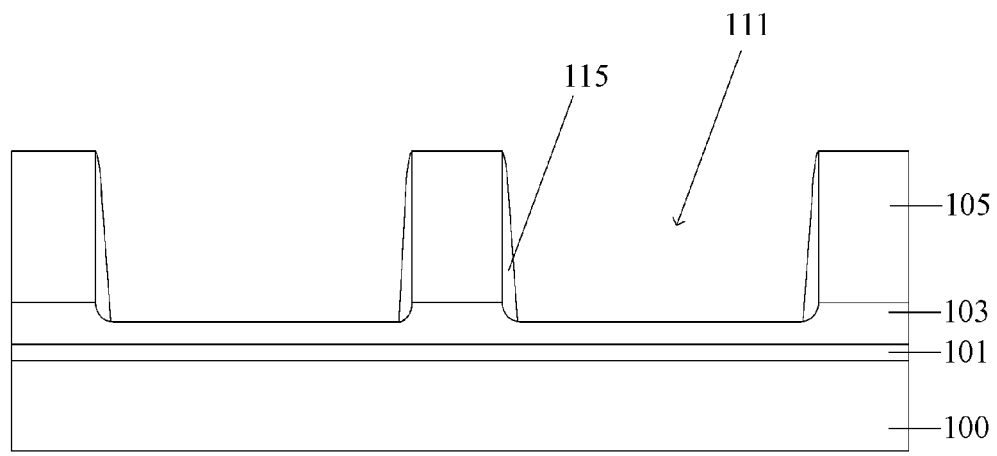

Referring to FIGS. 4 and 5, a protective sidewall 115 is formed on a sidewall of the first groove 111.

Referring to FIG. 4, a protective sidewall material layer 113 is formed on the sidewall and the bottom of the first groove 111, and the protective sidewall material layer 113 is etched (by an anisotropy blank and dry etching process) to form the protective sidewall 115 on the sidewall of the first groove 111, as shown in FIG. 5.

In some embodiments, the protective sidewall 115 may include silicon oxide. On one hand, the protective sidewall 115 including silicon oxide has enough dielectric function. On the other hand, if silicon oxide is used as the material of the protective sidewall 115, etching selectivity of the protective sidewall 115 to the mask layer 105 is relatively high when the mask layer 105 is removed, so that the protective sidewall 115 is prevented from being greatly removed by etching. Besides, process for forming silicon oxide is mature and simple, requires relatively low cost, and has wide step coverage.

In some embodiments, a high Temperature Oxide layer (HTO) Chemical vapor deposition (CVD) process may be used to form the protective sidewall material layer 113, which may improve the step coverage of the protective sidewall material layer 113 and make the thickness of the protective sidewall to be formed relatively uniform from top to bottom.

In some embodiments, thickness of the protective sidewall 115 may be within a range from 200 Å to 250 Å. Although selecting silicon oxide as the protective sidewall 115 can ensure a relatively high etching selectivity of the protective sidewall 115 to the mask layer 105, it is impossible that the protective sidewall 115 is not etched at all. That is to say, the thickness of the protective sidewall 115 may be decreased during the process for etching the mask layer 105. Besides, when the floating gate layer 103 under the mask layer 105 is etched subsequently, the protective sidewall 115 is further etched, which may further decrease the thickness of the protective sidewall 115. Therefore, when forming the protective sidewall 115, it is necessary to control the thickness of the protective sidewall 115 over 200 Å, so that the thickness of the protective sidewall 115 finally remained can meet requirements. Meanwhile, if the thickness of the protective sidewall 115 finally remained is too great, thickness of a gate dielectric layer to be formed subsequently may not meet requirements. Therefore, when forming the protective sidewall 115, it is also necessary to control the thickness of the protective sidewall 115 less than 250 Å.

Figure 6:
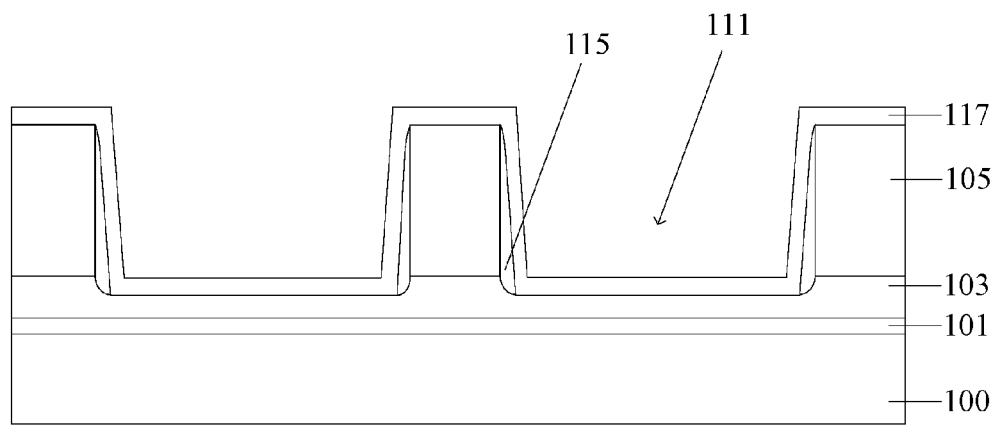

Referring to FIG. 6, a gate dielectric layer 117 is formed on the bottom and the sidewall of the first groove 111. As described above, the protective sidewall 115 is formed on the sidewall of the first groove 111, thus, the gate dielectric layer 117 also covers the protective sidewall 115.

In some embodiments, an oxide-nitride-oxide (ONO) layer is employed as the gate dielectric layer 117, which, compared with other materials, may result in better dielectric performance of the gate dielectric layer 117. In some embodiments, the gate dielectric layer 117 may have a single-layer structure or a multiple-layer structure. When the gate dielectric layer 117 is a single layer, it may include silicon oxide or silicon nitride.

It should be noted that, in some embodiments, the floating gate layer 103 at the bottom of the first groove 109 may be not etched. Instead, the protective sidewall 115 is formed directly on the sidewall of the first groove 109, and the gate dielectric layer 117 is formed to cover the bottom and the sidewall of the first groove 109.

Figure 7:
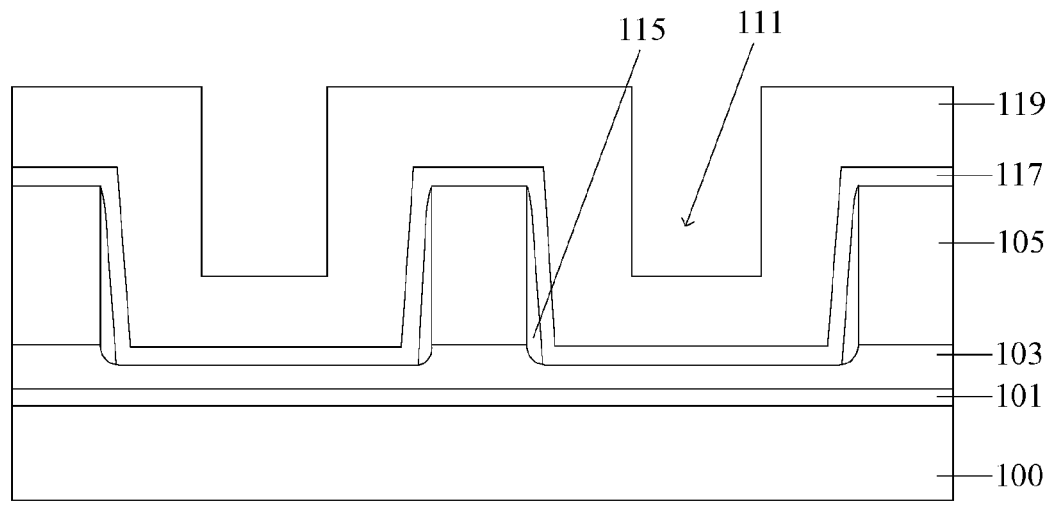
Figure 8:
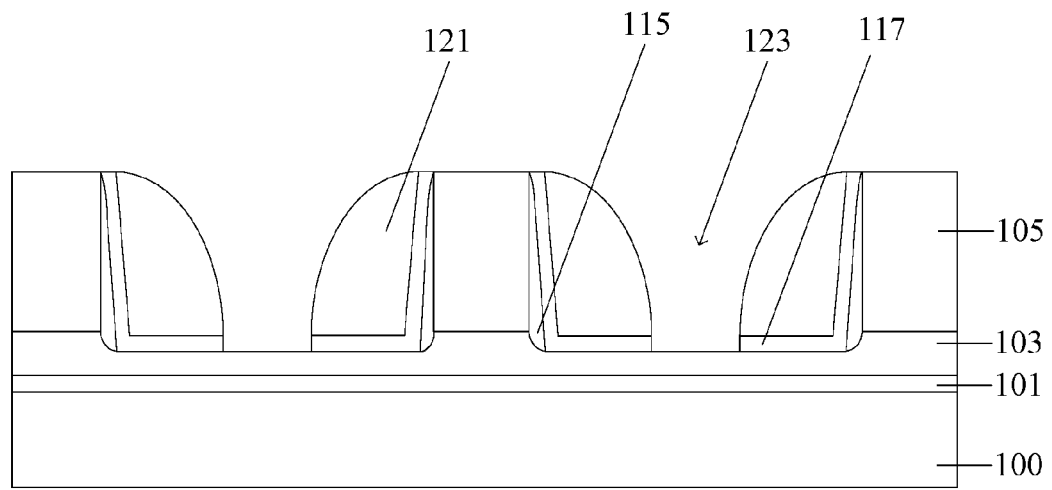

Referring to FIGS. 7 and 8, two discrete control gates 121 are formed on the gate dielectric layer 117 in the first groove 111, where remained portion of the first groove 111 serves as a second groove 123.

Referring to FIG. 7, in some embodiments, a gate material layer 119 is formed to cover the bottom and the sidewall of the first groove 111, and the gate material layer 119 is etched to form the two discrete control gates 121 as shown in FIG. 8. Therefore, it can be seen from above that a mirror structure is formed here.

In some embodiments, the two discrete control gates 121 cover the gate dielectric layer 117 formed on two sidewalls of the first groove 111, respectively. And the remained portion of the first groove 111 between the two discrete control gates 121 serves as the second groove 123.

In some embodiments, both the gate material layer 119 and the gate dielectric layer 117 on the mask layer 105 are removed.

In some embodiments, the control gates 121 may include polysilicon.

Figure 9:
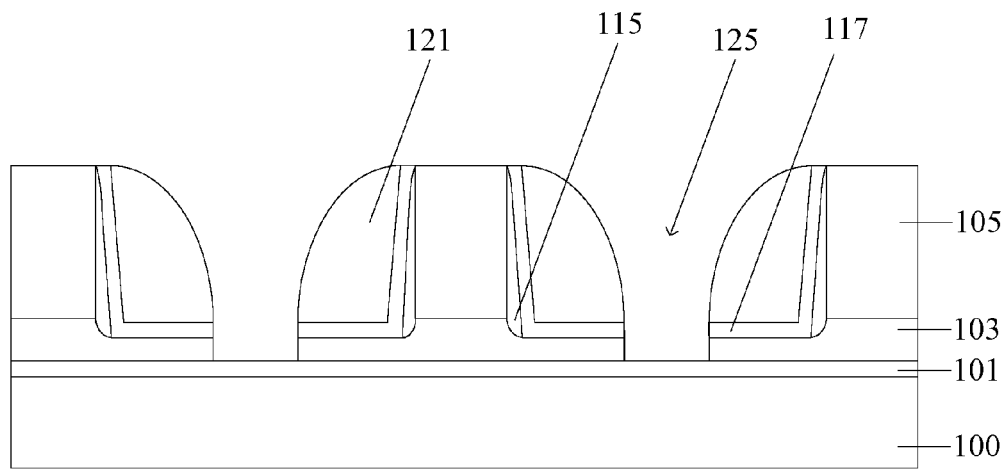

Referring to FIG. 9, the gate dielectric layer 117 and the floating gate layer 103 at the bottom of the second groove 123 are etched until a third groove 125 which exposes the first dielectric layer 101 is formed.

In some embodiments, the gate dielectric layer 117 and the floating gate layer 103 may be etched using an anisotropy dry etching process.

Figure 10:
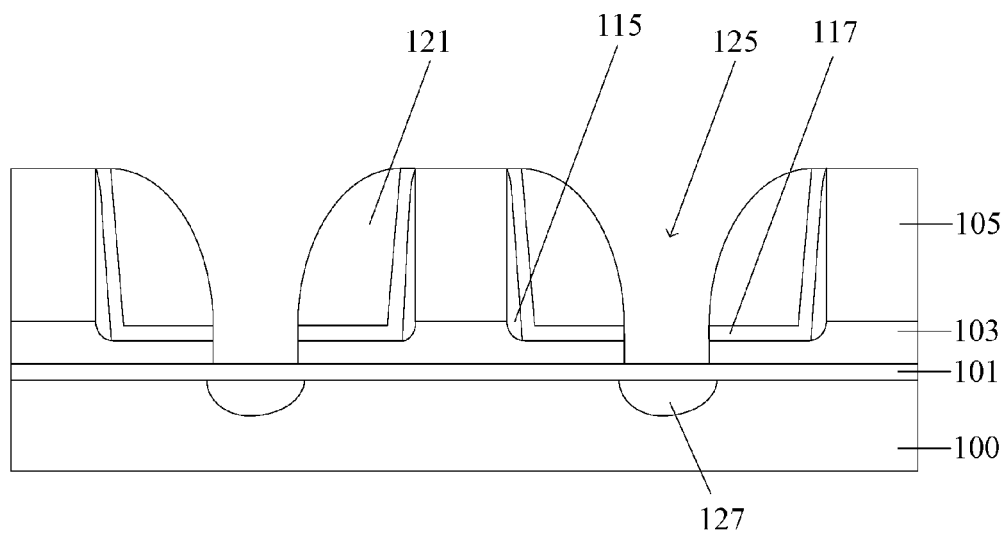

Referring to FIG. 10, a source 127 is formed in the semiconductor substrate 100 under the third groove 125.

In some embodiments, the source 127 may be formed using a heavily-doped injection process. The first dielectric layer 101 at the bottom of the third groove 125 may not influence the formation of the source 127. On the contrary, the first dielectric layer 101 at the bottom of the third groove 125 can prevent a surface of the semiconductor substrate 100 from being affected by ion injection, which may benefits the formation of the source 127.

Figure 11:
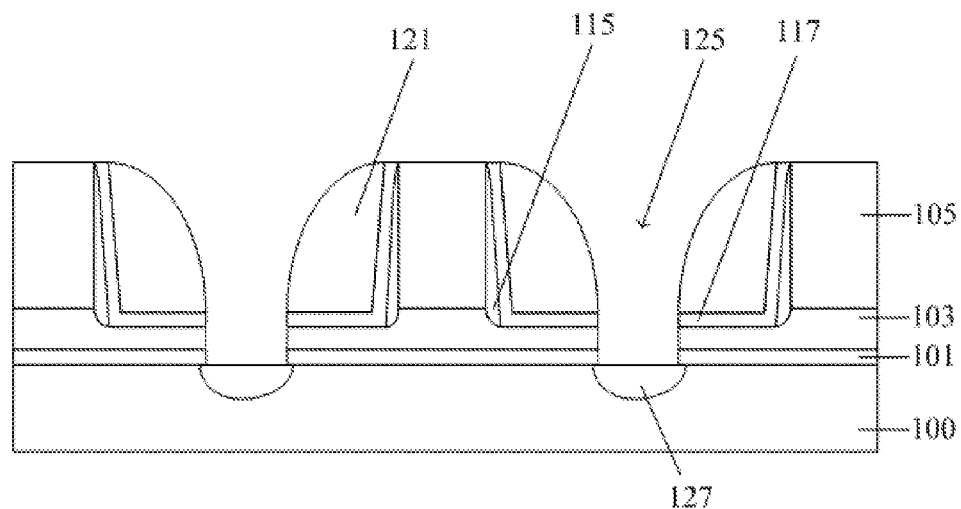

Optionally, referring to FIG. 11, in some embodiments, after the source 127 is formed, the third groove 125 may be cleaned to remove the first dielectric layer 101 at the bottom of the third groove 125, so that a second dielectric layer to be formed subsequently may fill the third groove 125 from the surface of the semiconductor substrate 100.

Figure 12:
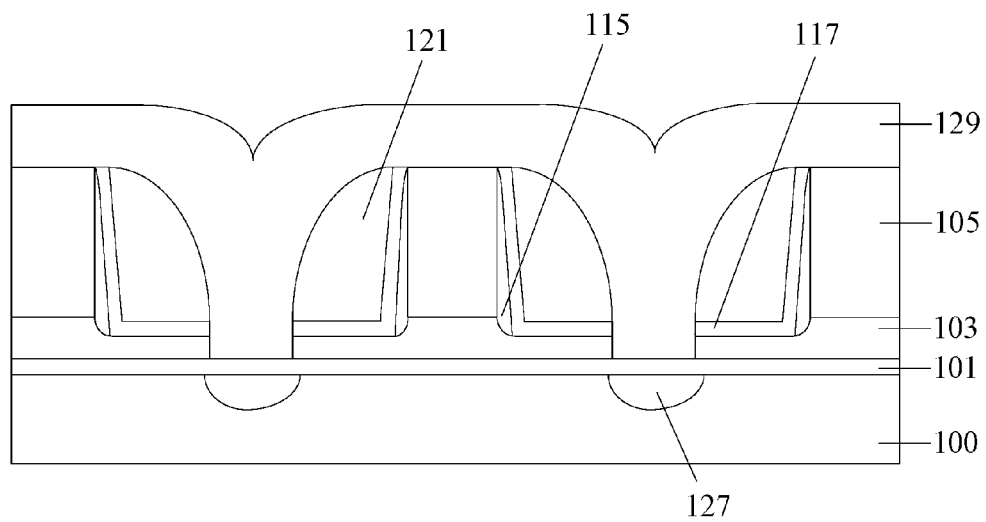
Figure 13:
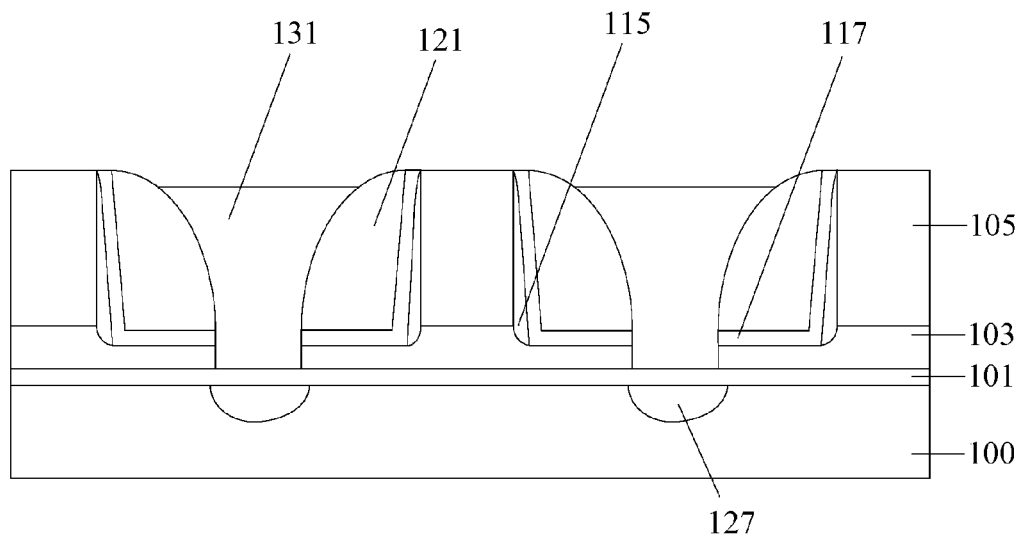

Referring to FIGS. 12 and 13, a second dielectric layer 131 is formed in the third groove 125.

Referring to FIG. 12, in some embodiments, a second dielectric material layer 129 is formed in the third groove 125. Referring to FIG. 13, the second dielectric material layer 129 is etched to remove a portion of the second dielectric material layer 129 on an upper surface of the mask layer 105 and on an upper surface of the control gates 121, to form the second dielectric layer 131.

In some embodiments, the second dielectric layer 131 may include silicon oxide.

In some embodiments, the second dielectric layer 131 is formed on the first dielectric layer 101. As described above, in some embodiments, the first dielectric layer 101 at the bottom of the third groove 125 may be removed, thus, the second dielectric layer 131 may be formed directly on the semiconductor substrate 100.

Referring to FIG. 14, after the second dielectric layer 131 is formed, the mask layer 105 is removed to form a fourth groove 133.

In some embodiments, the mask layer 105 may be removed by following steps: forming a protective layer to protect formed structures and expose the mask layer 105; and removing the mask layer 105 using an anisotropy dry etching process.

Figure 15:
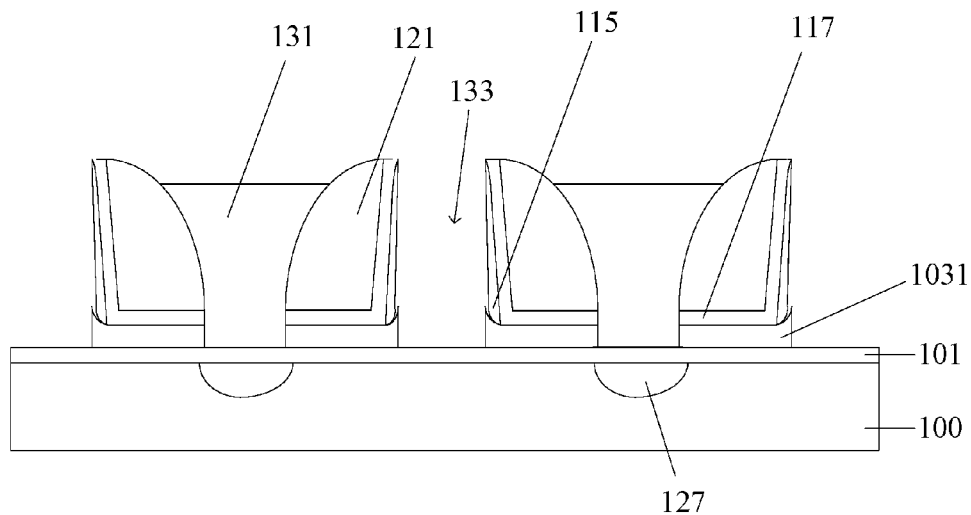

Referring to FIG. 15, a portion of the floating gate layer 103 at the bottom of the fourth groove 133 is removed, where remained portion of the floating gate layer 103 serves as a floating gate 1031.

In some embodiments, the portion of the floating gate layer 103 may be etched together with the mask layer 105. In some embodiments, the portion of the floating gate layer 103 may be etched by a dependent anisotropy dry etching process.

As described above, thickness of the protective sidewall 115 is within a range from 200 Å to 250 Å. When forming the fourth groove 133 and etching the portion of the floating gate layer 103 at the bottom of the fourth groove 133, the protective sidewall 115 may be etched partially. The thickness of the remained protective sidewall 115 may be within a range from 150 Å to 200 Å. On one hand, it is necessary to control the thickness of the remained protective sidewall 115 over 150 Å, so that the protective sidewall 115 can protect the gate dielectric layer 117 not to be affected by etching, and the protective sidewall 115 together with the gate dielectric layer 117 can suffer a relatively high working voltage between the control gates 121 and word lines to be formed subsequently. Meanwhile, if the thickness of the remained protective sidewall 115 is too great, thickness of the gate dielectric layer 117 may be limited and cannot meet requirements. Therefore, it is also necessary to control the thickness of the remained protective sidewall 115 less than 200 Å. When the thickness of the remained protective sidewall 115 is within the range from 150 Å to 200 Å, thickness of the gate dielectric layer 117 (for example, an ONO layer) may be about 140 Å, so that the protective sidewall 115 together with the gate dielectric layer 117 can suffer the relatively high working voltage between the control gates 121 and the word lines during an erase process.

The protective sidewall 115 being etched partially when the fourth groove 133 is formed and the portion of the floating gate layer 103 at the bottom of the fourth groove 133 is etched may have following advantages. When the protective sidewall 115 is partially etched, the tip mentioned in the description of forming the first groove 111 may be exposed, as shown in FIG. 15. As having the tip, when an erase operation is performed, the floating gate 1031 may use the tip to perform corona discharging, which may improve the erase ability of the flash memory.

Besides, forming the protective sidewall 115 can prevent the gate dielectric layer 117 from being affected by processes for forming the fourth groove 133 and etching the portion of the floating gate layer 103 at the bottom of the fourth groove 133, so that the gate dielectric layer 117 can retain well, and reliability and durability of the flash memory may be improved.

Figure 16:
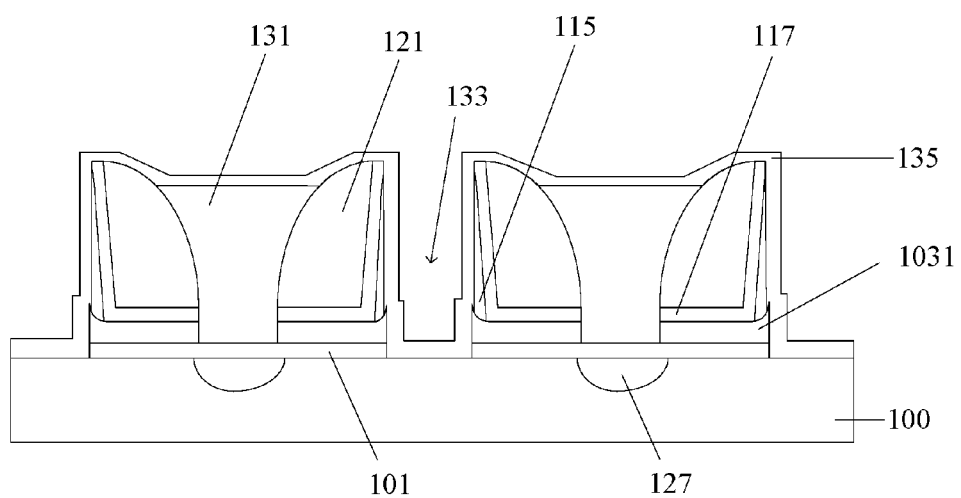

Referring to FIG. 16, a tunnel dielectric layer 135 is formed on bottom and a sidewall of the fourth groove 133, on the upper surface of the control gates 121, and on an upper surface of the second dielectric layer 131.

In some embodiments, before forming the tunnel dielectric layer 135, the fourth groove 133 may be cleaned, so that the first dielectric layer 101 at the bottom of the fourth groove 133 is cleaned and the tunnel dielectric layer 135 to be formed subsequently may be formed in contact with the semiconductor substrate 100. In some embodiments, the first dielectric layer 101 at the bottom of the fourth groove 133 may not be removed.

In some embodiments, the tunnel dielectric layer 135 may include silicon oxide. Process for forming the tunnel dielectric layer 135 is well known in the art, and not described in detail here.

Figure 17:
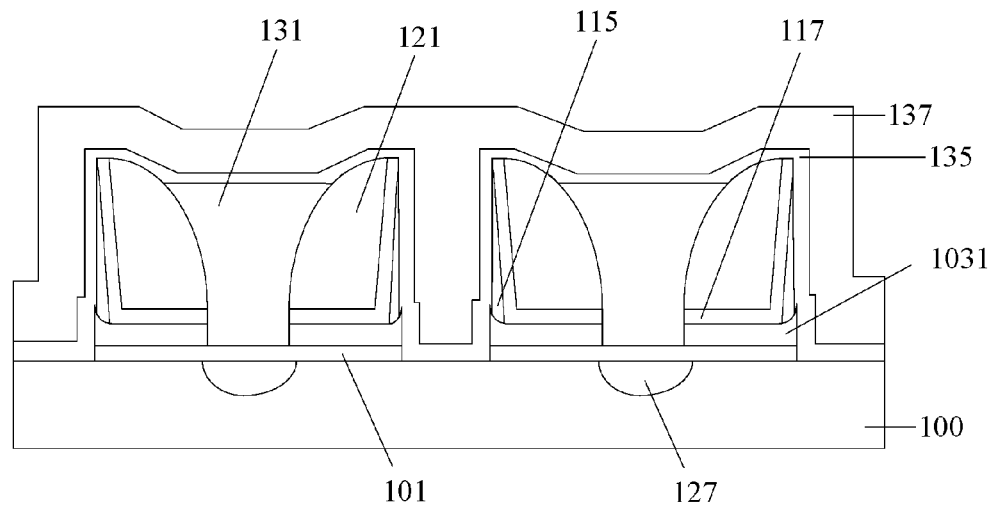
Figure 18:
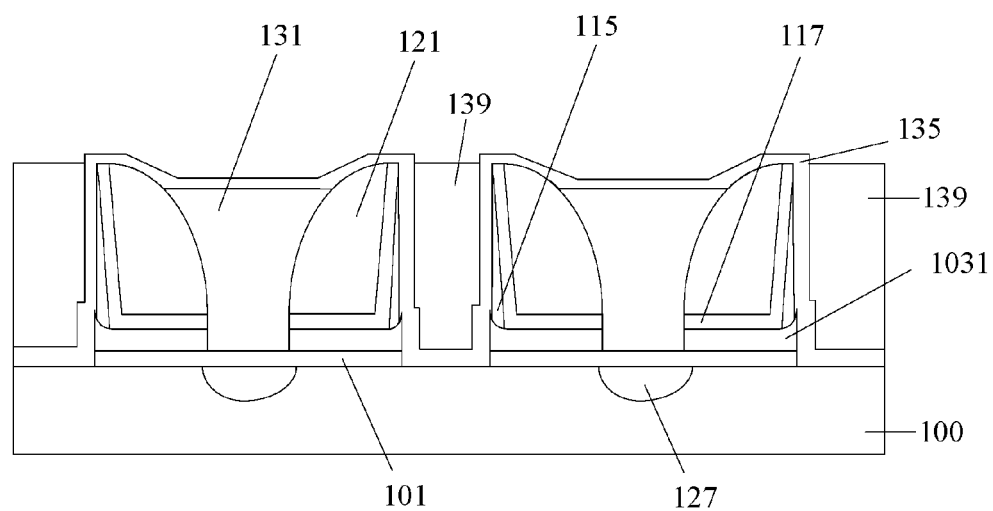

Referring to FIGS. 17 and 18, a word line 139 is formed in the fourth groove 133.

Referring to FIG. 17, in some embodiments, a word line material layer 137 is formed to fill the fourth groove 133 and cover the tunnel dielectric layer 135. Afterward, referring to FIG. 18, the word line material layer 137 is etched using a planarization process or an etching process, to form the word line 139.

In some embodiments, the word line 139 may include polysilicon. Other processes for forming the word line 138 that are well known in the art are also possible.

Figure 19:
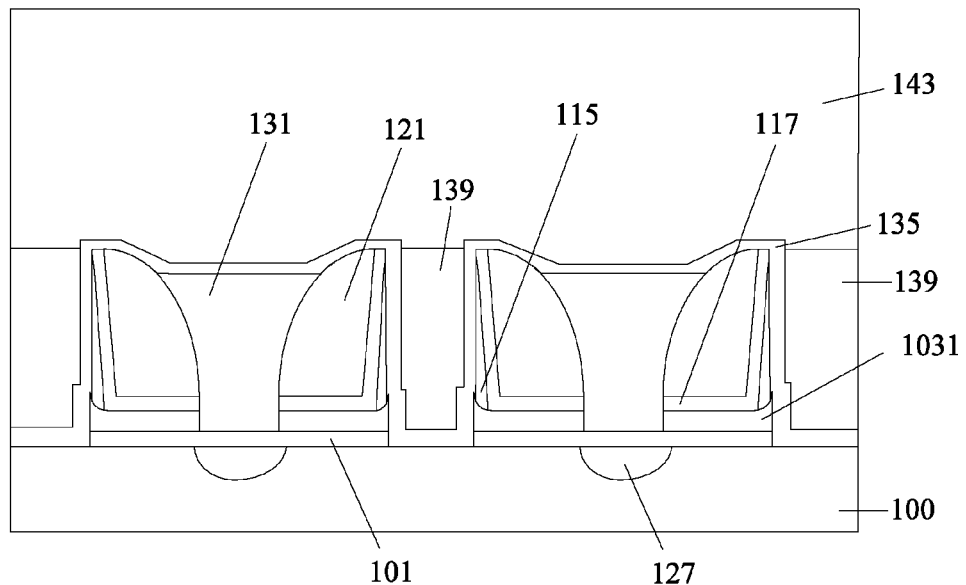
Figure 20:
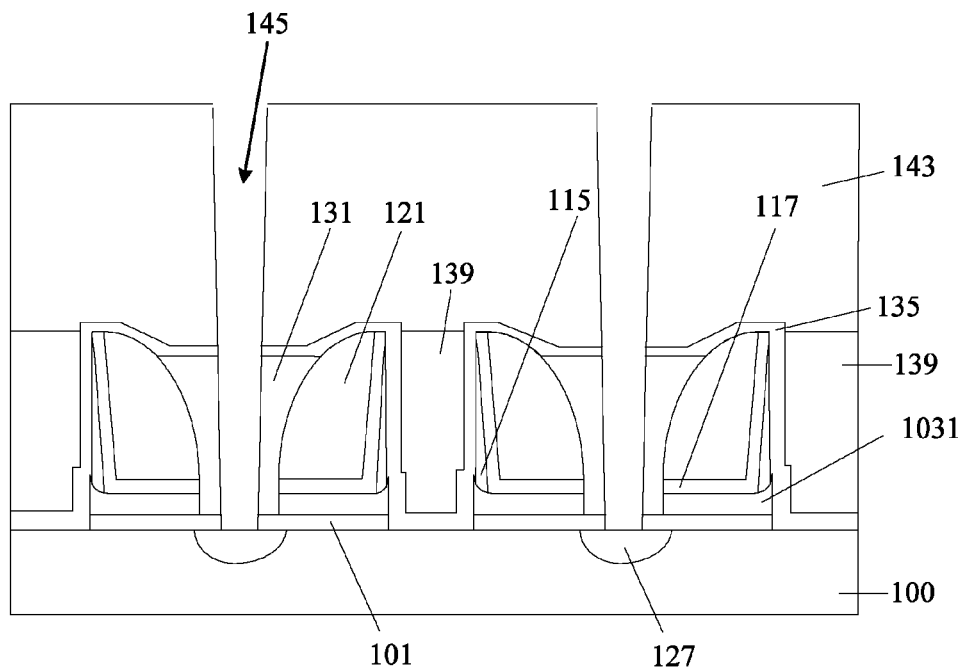
Figure 21:
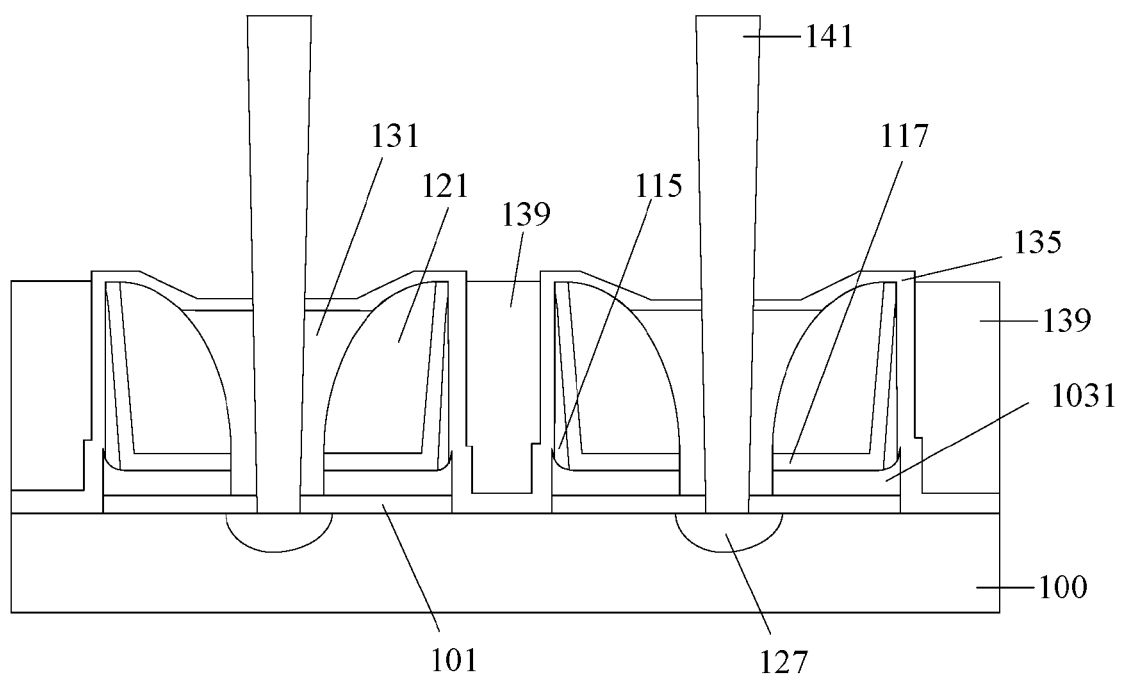

Referring to FIGS. 19 to 21, an interlayer dielectric layer 143 is formed to cover the word line 139 and the tunnel dielectric layer 135, a portion of the second dielectric layer 131, a portion of the tunnel dielectric layer 135 and a portion of the interlayer dielectric layer 143 over the source 127 are etched to form a through hole 145 that exposes the source 127, and a contact plug 141 is formed in the through hole 145 so that the contact plug 141 can be electrically connected with the source 127.

From above, in embodiments of the present disclosure, the semiconductor substrate 100 is provided, the first dielectric layer 101 is formed on the semiconductor substrate 100, the floating gate layer 103 is formed on the first dielectric layer 101, and the mask layer 105 is formed on the floating gate layer 103. The mask layer 105 is etched until the first groove 111 which exposes the floating gate layer 103 is formed (referring to FIG. 3). The protective sidewall 115 is formed on the sidewall of the first groove 111, and the gate dielectric layer 117 is formed on the bottom and the sidewall of the first groove 111. Two discrete control gates 121 are formed on the gate dielectric layer 117 in the first groove 111, where remained portion of the first groove 111 serves as the second groove 123 (referring to FIG. 8). The gate dielectric layer 117 and the floating gate layer 103 at the bottom of the second groove 123 are etched until the third groove 125 which exposes the first dielectric layer 101 is formed (referring to FIG. 9). The second dielectric layer 131 is formed in the third groove 125, and the source 127 is formed in the semiconductor substrate 100 under the third groove 125 (referring to FIG. 10). Based on the above process, the protective sidewall 115 is remained between the word line 139 and the control gates 121. Due to the protective sidewall 115, thickness of a dielectric layer between the word line 139 and the control gates 121 is increased, so that the dielectric layer can suffer a relatively high working voltage between the word line 139 and the control gates 121 during the erase process, and this may further improve the reliability and the durability of the flash memory formed.

In an embodiment, a split-gate flash memory having a mirror structure is provided. The split-gate flash memory may be formed by the method described above. Therefore, above-mentioned information can be referred.

Referring to FIG. 21, in some embodiments, the split-gate flash memory may include a semiconductor substrate 100, a source 127 in the semiconductor substrate 100, a second dielectric layer 131 disposed over the source 127, a first dielectric layer 101 disposed on the semiconductor substrate 100 on two sides of the second dielectric layer 131, a floating gate 1031 disposed on the first dielectric layer 101, a gate dielectric layer 117 disposed on the floating gate 1031, a control gate 121 disposed on the gate dielectric layer 117, a tunnel dielectric layer 135 disposed on a sidewall of the floating gate 1031, on a sidewall of the gate dielectric layer 117 and on an upper surface of the control gate 121, and a word line 139 disposed on a sidewall of the tunnel dielectric layer 135. The split-gate flash memory may further include a protective sidewall 115 disposed between the sidewall of the tunnel dielectric layer 135 and the sidewall of the gate dielectric layer 117, an interlayer dielectric layer 143 covering the tunnel dielectric layer 135, and a contact plug 141 which penetrates the interlayer dielectric layer 143, the tunnel dielectric layer 135 and the second dielectric layer 131, where the contact plug 141 is electrically connected with the source 127.

In some embodiments, the protective sidewall 115 may include silicon oxide. Thickness of the protective sidewall 115 may be within a range from 150 Å to 200 Å. Reasons for the material and the numerical values can be referred to above description.

In the split-gate flash memory, as the protective sidewall 115 is disposed between the word line 139 and the control gate 121, the thickness of the dielectric layer between the word line 139 and the control gate 121 is increased, so that the dielectric layer can suffer a relatively high working voltage between the word line 139 and the control gates 121 during an erase process, and this may further improve reliability and durability of the split-gate flash memory.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A method for forming a split-gate flash memory having a mirror structure, comprising:
   providing a semiconductor substrate;
   forming a first dielectric layer on the semiconductor substrate;
   forming a floating gate layer on the first dielectric layer;
   forming a mask layer on the floating gate layer;
   etching the mask layer until a first groove which exposes the floating gate layer is formed;
   forming a protective sidewall on a sidewall of the first groove;
   forming a gate dielectric layer on the bottom and the sidewall of the first groove;
   forming two discrete control gates on the gate dielectric layer in the first groove, wherein the first groove after the two discrete control gates are formed serves as a second groove;
   etching the gate dielectric layer and the floating gate layer at the bottom of the second groove until a third groove which exposes the first dielectric layer is formed;
   forming a source in the semiconductor substrate under the third groove;
   forming a second dielectric layer in the third groove;
   after the second dielectric layer is formed, removing the mask layer to form a fourth groove;
   removing the floating gate layer at bottom of the fourth groove;
   forming a tunnel dielectric layer on bottom and a sidewall of the fourth groove, on an upper surface of the control gate and on an upper surface of the second dielectric layer;
   forming a word line in the fourth groove;
   forming an interlayer dielectric layer to cover the word line and the tunnel dielectric layer;
   etching a portion of the second dielectric layer, a portion of the tunnel dielectric layer and a portion of the interlayer dielectric layer over the source to form a through hole that exposes the source; and
   forming a contact plug in the through hole.

2. The method according to claim 1, wherein the protective sidewall comprises silicon oxide.

3. The method according to claim 1, wherein thickness of the protective sidewall when the protective sidewall is formed is within a range from 200 Å to 250 Å; and
   when the fourth groove is formed, the protective sidewall is etched partially, and thickness of the protective sidewall after the fourth groove is formed is within a range from 150 Å to 200 Å.

4. The method according to claim 1, further comprising:
   before the gate dielectric layer is formed, etching a portion of the floating gate layer at the bottom of the first groove by using the mask layer as a mask, so that the first groove has a cambered bottom.

5. The method according to claim 1, wherein the second dielectric layer comprises silicon oxide.

6. The method according to claim 1, further comprising:
   after the source is formed, cleaning the third groove to remove the first dielectric layer at the bottom of the third groove.

* * * * *